United States Patent [19]
Farnworth et al.

[11] Patent Number: 5,953,216
[45] Date of Patent: Sep. 14, 1999

[54] METHOD AND APPARATUS FOR REPLACING A DEFECTIVE INTEGRATED CIRCUIT DEVICE

[75] Inventors: Warren M. Farnworth, Nampa; Kevin Duesman, Boise, both of Id.

[73] Assignee: Micron Technology, Boise, Id.

[21] Appl. No.: 08/915,190

[22] Filed: Aug. 20, 1997

[51] Int. Cl.⁶ .............................. H05K 7/02; G06F 11/00
[52] U.S. Cl. ......................... 361/777; 361/760; 361/783; 257/723; 257/777; 438/130; 395/182.05; 174/261; 371/10.2
[58] Field of Search ..................................... 361/777, 778, 361/783, 805, 760; 257/209, 686, 723, 724, 777; 438/129, 130; 174/260, 261; 371/10.2, 10.3; 395/182.05

[56] References Cited

U.S. PATENT DOCUMENTS

| | | | |
|---|---|---|---|
| 4,567,643 | 2/1986 | Droguet et al. | 257/777 |
| 5,598,373 | 1/1997 | Wada et al. | 371/10.3 |

*Primary Examiner*—Leo P. Picard
*Assistant Examiner*—John B. Vigushin
*Attorney, Agent, or Firm*—Seed and Berry LLP

[57] ABSTRACT

An apparatus and method for operatively substituting a replacement device for a defective component in an electrical assembly. The apparatus preferably includes a first primary site adapted to engage a first component, a second primary site adapted to engage a second component, and a replacement site adapted to engage a replacement device. The replacement site has a first dedicated replacement terminal coupled to a first dedicated terminal of the first primary site, and second dedicated replacement terminal coupled to a second dedicated terminal of the second primary site. The replacement site further includes a common replacement terminal coupled to common terminals of both the first and second primary sites. In operation, the replacement device is attached to the replacement site and coupled to the common replacement terminal. Additionally, the replacement device is coupled to the first dedicated replacement terminal if the replacement device is to substitute for the first component. Conversely, the replacement device is coupled to the second dedicated replacement terminal if the replacement device is to substitute for the second component. The primary device for which the replacement device is substituted is also disabled without removing it from the printed circuit board by supply voltage from the component or by applying a supply voltage to a selected connector of the component. For example, when the component is a memory device, a supply voltage may be applied to a $\overline{RAS}$ terminal of the component to bring the $\overline{RAS}$ terminal high and effectively disable the component.

65 Claims, 7 Drawing Sheets

METHOD AND APPARATUS FOR REPLACING A DEFECTIVE INTEGRATED CIRCUIT DEVICE

TECHNICAL FIELD

The present invention is directed toward a method and apparatus for quickly repairing integrated circuit devices in electrical assemblies, such as memory modules and other devices.

BACKGROUND OF THE INVENTION

Integrated circuit (IC) devices are often used in computers, communications equipment, televisions, and many other products. In a typical application, several IC devices are mounted to a printed circuit board ("PCB") to form a PCB assembly ("PCA") that may be easily installed in a product. For example, computer memory modules, such as Single In-line Memory Modules ("SIMMs") and Dual In-line Memory Modules ("DIMMs"), generally have a number of IC devices mounted closely together on the printed circuit board.

Although electronics manufacturers strive to produce operable IC devices, a few PCAs may be defective because one or more of the IC devices on a PCA may be defective or otherwise impaired. The electronics manufacturing industry is highly competitive, and thus it is important to have a high yield and through-put of operable products during manufacture. To improve yields and maintain through-put, each defective IC device is generally replaced with a new IC device so that the time and the operable components invested in the other IC devices in the defective PCA are not wasted. Conventional replacement processes, however, raise several manufacturing issues regarding the yield and through-put of PCAs and the risk of damage to nondefective components.

In one conventional replacement operation, the defective IC device is physically removed from the PCB and replaced with a new IC device. Physically removing the defective IC device is generally undesirable because it is time-consuming to disconnect the electrical connections and/or the adhesives used to mount the defective IC device to the PCB. Physically removing the defective device may also be undesirable because other operable devices on the PCB may be damaged or destroyed. For example, it may be difficult to remove a defective component without inadvertently damaging other components. Thus, replacement operations that physically remove defective IC devices may reduce the manufacturing yield and through-put by damaging other previously operable devices on the PCB.

In another conventional replacement process, the contacts of the defective device are heated to reflow the contacts so that the defective device can be removed from the PCB. To heat the contacts, either the whole PCA is heated, or just the individual contacts of the defective device are individually heated. Heating the PCA or the defective device, however, is generally undesirable because the operable devices surrounding the defective device are also heated. As a result, some of the contacts connecting the operable devices to the rest of the circuit may loosen or break. Additionally, the circuitry in the operable devices may be impaired because dopants, silicon structures, or other structures in an IC device may be altered at high temperatures. Heating the PCA or the defective device is also undesirable because it may be time-consuming. Thus, replacement operations that heat the PCA or the individual contacts of the defective device may also reduce the manufacturing yield and through-put by damaging previously operable devices.

SUMMARY OF THE INVENTION

The present invention is directed, in part, toward an electronic assembly and a method for repairing an electronic assembly in which at least one component is defective or otherwise impaired. In one embodiment, a replacement device is operatively substituted for a defective component without physically removing the defective component from the electronic assembly. To disable the defective component without physically removing it from the electronic assembly, a voltage applied to a selected terminal of the defective component may be manipulated to place the defective component at a high impedance state or otherwise electrically isolate the defective component so that it is operationally removed from the circuit. The replacement device may then be coupled to the circuitry of the electronic assembly so that the replacement device operates in place of the defective component. In one embodiment, the electronic assembly is a printed circuit board that includes a first primary site and a second primary site. The first primary site has a first common terminal and a first dedicated terminal that may be coupled to a first component, and the second primary site has a second common terminal and a second dedicated terminal that may be coupled to a second component. The printed circuit board also has a replacement site to which a replacement device may be coupled to operate in place of either the first or the second components in the event that one of the components is defective. More specifically, the replacement site may include a first dedicated replacement terminal coupled to the first dedicated terminal of the first primary site, a second dedicated replacement terminal coupled to the second dedicated terminal of the second primary site, and a common replacement terminal coupled to both the first and second common terminals. In general, each site has a plurality of common terminals corresponding to signals and other connections that are common to all of the devices (e.g., $\overline{RAS}$ and $\overline{V_{cc}}$), and each site has at least one dedicated terminal for signals that are unique to the component coupled to the specific site (e.g., a column address strobe ($\overline{CAS}$) signal).

In operation, the method and electronic assembly may be particularly useful for repairing a defective memory module. If a first memory device is defective, it is operatively disabled without being removed from the first primary site and a replacement memory device is coupled to the replacement site to operate in place of the first memory device. For example, the $\overline{RAS}$ terminal of the first memory device may be coupled to $V_{cc}$ to disable the first memory device and then the replacement device may be coupled to the common replacement terminals (e.g., $\overline{RAS}$ and $\overline{V_{cc}}$) and the first dedicated terminal (e.g., $\overline{CAS}$) of the replacement site to substitute for the first memory device. Similarly, if a second memory device is defective, the replacement device is coupled to the common terminals and the second dedicated terminal of the replacement site to substitute for the second memory device. In one embodiment of the electronic assembly, the replacement site is a separate site on a surface of the printed circuit board. In another embodiment, the replacement site may be a surface on the defective component.

DETAILED DESCRIPTION OF THE INVENTION

The present invention is a method and apparatus for repairing an electrical assembly with a defective IC device or other type of component without physically detaching the defective component from the electrical assembly. One aspect of the invention may be to provide a PCA that has a plurality of components and at least one replacement site pre-wired to receive a replacement device so that the replacement device can substitute for any one of the components. In another embodiment of the invention, a defective component is disabled without physically detaching the defective component from the PCB. For example, the defective component may be operatively disabled by connecting a sufficient voltage to a selected terminal (e.g., $\overline{RAS}$) of the defective component, or the supply voltage may be disconnected from the $V_{cc}$ terminal of the defective component.

FIGS. 1–6 illustrate embodiments of electronic assemblies and methods in accordance with the invention in which like reference numbers refer to like parts throughout the figures.

Figure 1:
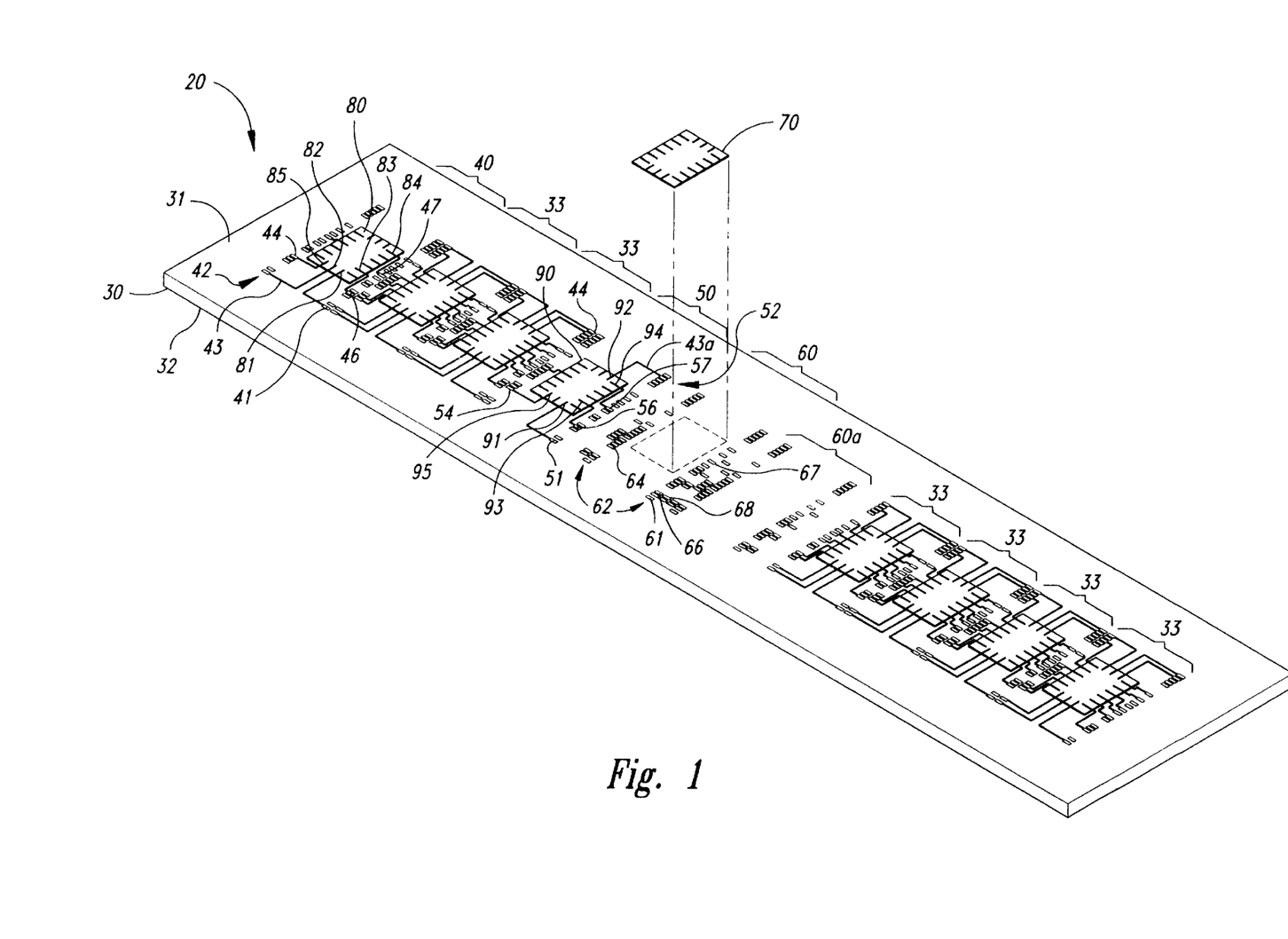
FIG. 1 is an exploded isometric view of an embodiment of an apparatus in accordance with the invention for substituting a replacement device for a defective component.

FIG. 1 is an isometric view of one embodiment of the invention in which a PCB assembly 20 includes a printed circuit board 30 containing a defective component for which a replacement device may be substituted. The PCA 20 shown in FIG. 1 is a SIMM, but the invention is also applicable to other electrical assemblies. To best understand the operation of the PCA 20, the aspect of coupling a replacement device to the PCB 30 will be described first, and then the aspect of disabling the defective device will be described.

The PCB 30 shown in FIG. 1 has at least a first primary site 40 to which a first component 80 is connected and a second primary site 50 to which a second component 90 is connected. The PCB 30 may also include a replacement site 60 to which a replacement IC device 70 may be connected when either one of the first or second components 80 or 90 is defective. The replacement site 60 is pre-wired (not shown) to the first and second primary sites 40 and 50 within the PCB 30 so that the replacement IC device 70 can be quickly coupled to the PCB 30 to substitute for either the first component 80 or the second component 90.

As shown in FIG. 1, the PCB 30 also has additional primary sites 33 and an additional replacement site 60a to provide the capacity for eight memory devices and two replacement devices on the SIMM. The replacement site 60 may be coupled to the primary sites 33, 40 and 50 on the left side of the PCB 30, while the replacement site 60a may be coupled to the primary sites 33 on the right side of the PCB 30. For purposes of illustration, however, only the replacement site 60 serving the first and second primary sites 40 and 50 will be described.

More specifically, the first primary site 40 of the PCB 30 has a plurality of first terminals 42 coupled via conductive lines 43 to corresponding bonding pads 82 on the first component 80. The conductive lines 43 are preferably gold wire-bonded lines that are formed by precise wire-bonding equipment known in the art. For purposes of clarity, only a few connections between selected terminals and bonding pads are shown and described herein. One such connection is between a first $V_{cc}$ terminal 41 on the PCB 30 and a first $V_{cc}$ pad 81 on the first component 80. Other connections may be between a first dedicated terminal 46 on the PCB 30 and a first dedicated pad 83 on the first component 80, and a first common terminal 47 on the PCB 30 and a first common pad 84 on the first component 80. The first dedicated terminal 46 receives and/or transmits signals unique to the first component 80, while the first common terminal 47 receives and/or transmits signals that are common to all of the components. In a specific embodiment in which the first component 80 is a memory device, a first $\overline{RAS}$ terminal 44 on the PCB 30 is coupled to a first $\overline{RAS}$ pad 85 on the first component 80.

Similarly, the second primary site 50 has a plurality of second terminals 52 connected to second bonding pads 92 on the second component 90 via conductive lines 43a. Accordingly, a second $V_{cc}$ terminal 51 on the PCB 30 is connected to a second $V_{cc}$ pad 91 on the second component 90 to provide a supply voltage to the second component 90. A second dedicated terminal 56 on the PCB 30 may also be connected to a second dedicated pad 93 on the second component 90 to receive and/or transmit signals unique to the second component 90. A second common terminal 57 on the PCB 30 may be connected to a second common pad 94 on the second component 90 to receive and/or transmit signals common to all of the components. The first and second common terminals 47 and 57 of the PCB 30 are accordingly coupled together (not shown) within the PCB 30 so that common signals are transmitted and/or received by the first and second components 80 and 90. Also, when the second component 90 is a memory device, the second component 90 has a second $\overline{RAS}$ pad 95 connected to a second $\overline{RAS}$ terminal 54 on the PCB 30 to transmit row address strobe signals to the second component 90.

Now referring to the specific structure of the replacement site 60 shown in FIG. 1, the replacement site 60 is preferably configured to couple the replacement device 70 to the PCB 30 in a manner in which the replacement device 70 can be substituted for any of the components 33, 40 and 50 on the left side of the PCB 30. For example, if either the first component 80 or the second component 90 becomes defective or requires replacement for any other reason, the replacement device 70 is coupled to the replacement device 60 to receive/transmit the signals associated with the particular defective component.

In the PCA 20 shown in FIG. 1, the replacement site 60 has a plurality of terminals 62 that are coupled via lines within the PCB 30 (not shown) to corresponding terminals of the primary sites 33, 40 and 50. For example, the plurality of terminals 62 may include a first dedicated replacement terminal 66 coupled to the first dedicated terminal 46 of the first primary site 40, a second dedicated terminal 68 coupled to the second dedicated terminal 56 of the second primary site 50, and a common terminal 67 coupled to both the first and second common terminals 47 and 57 of the first and second sites 40 and 50. The replacement site 60 may also have a $V_{cc}$ terminal 61 connected to the supply voltage, a replacement $\overline{RAS}$ terminal 64 that may be coupled within the PCB 30 to both the first and second $\overline{RAS}$ terminals 44 and 54 of the first and second primary sites 40 and 50. The replacement device 70 accordingly receives the row address strobe signal common to both the first and second components 80 and 90. The structures and connections of the first primary site 40, the second primary site 50, and the replacement site 60 shown in FIG. 1 will now be used to describe how the replacement component 70 is substituted for either the first or second components 80 or 90.

Figure 2A:
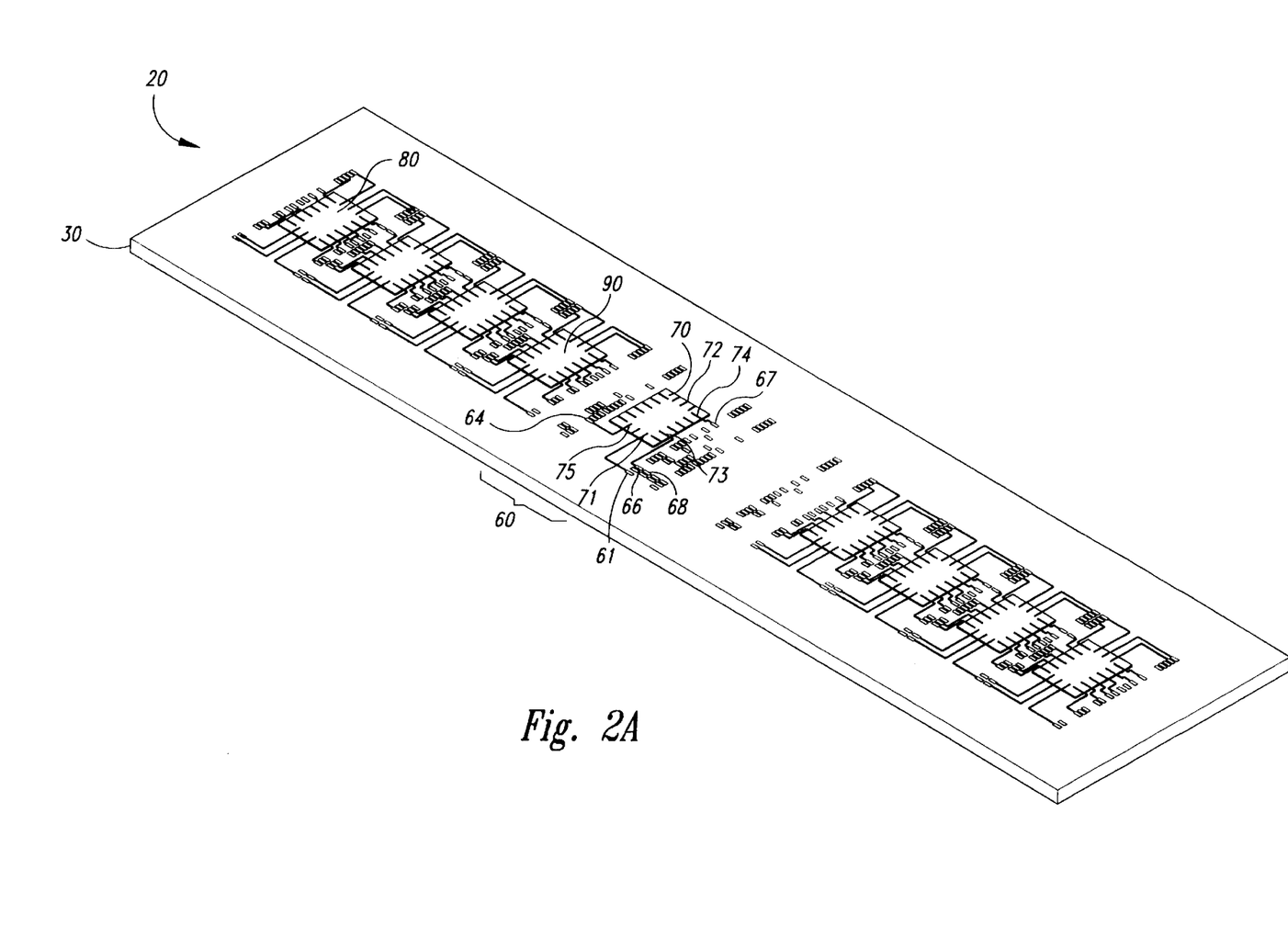
FIG. 2A is an isometric view of an embodiment of an apparatus in accordance with the invention with a replacement device coupled to a printed circuit board to operate in place of a first component.

FIG. 2A is an isometric view of the PCA 20 in which the replacement device 70 is coupled to the replacement site 60 to substitute for the first component 80. Accordingly, the $V_{cc}$ terminal 61 of the replacement site 60 is connected to a $V_{cc}$ pad 71 on the replacement device 70, the common terminal 67 of the replacement site 60 is connected to a common pad 74 on the replacement device 70, and the $\overline{RAS}$ terminal 64 of the replacement site 60 is connected to a $\overline{RAS}$ pad 75 on the replacement device 70. Additionally, the first dedicated replacement terminal 66 of the replacement site 60 is connected to a dedicated pad 73 on the replacement device 70 so that the replacement device 70 is coupled to the printed circuit board 30 to transmit and receive the same signals as the first component 80.

Figure 2B:
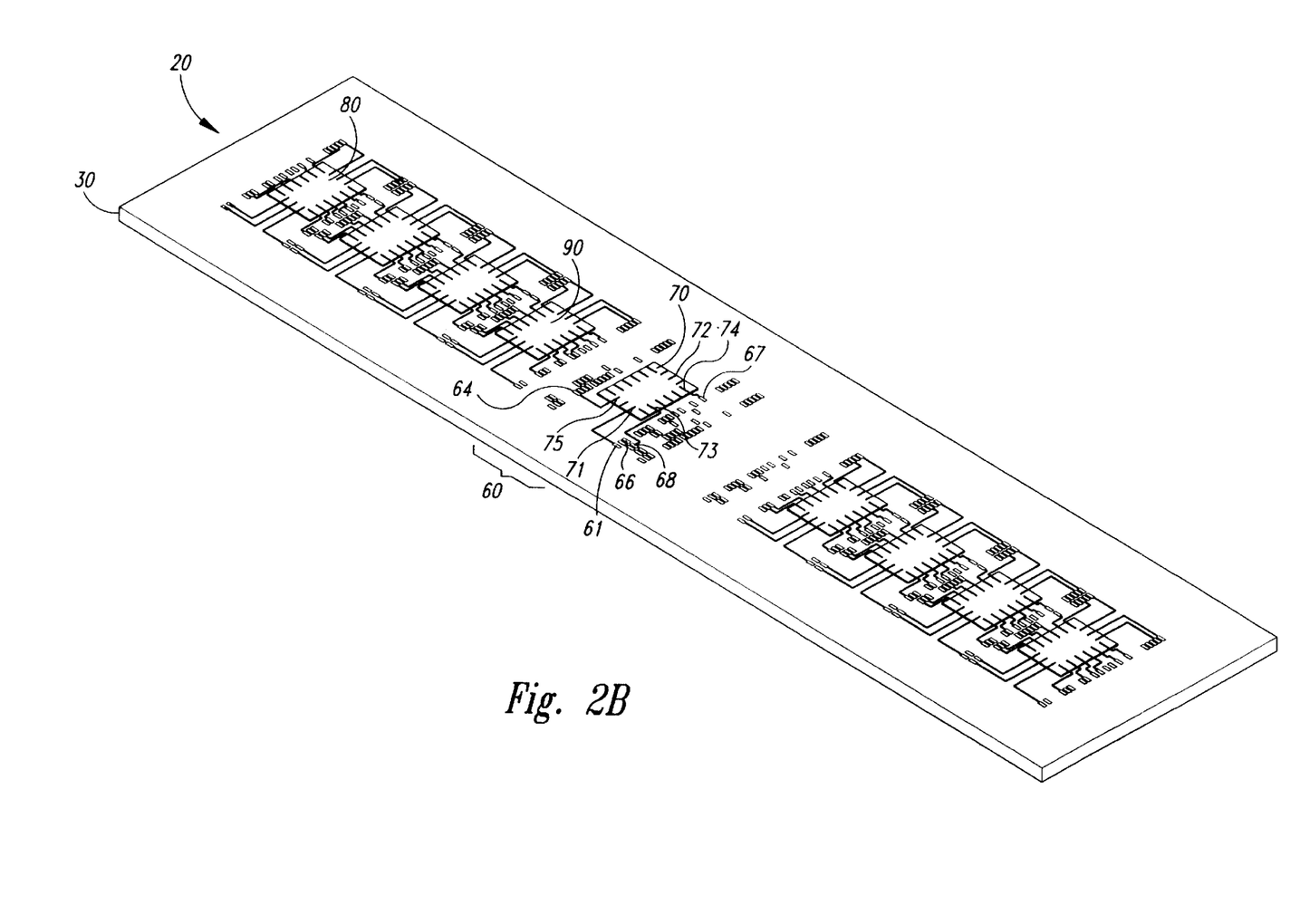
FIG. 2B is an isometric view of an embodiment of an apparatus in accordance with the invention with a replacement device coupled to a printed circuit board to operate in place of a second component.

FIG. 2B is an isometric view of another PCA 20 showing an alternate installation of the device 60 in which the replacement device 70 is coupled to the replacement site 60 to substitute for the second component 90. In this embodiment, the dedicated pad 73 on the replacement device 70 is coupled to the second dedicated replacement terminal 68 of the replacement site 60. The $V_{cc}$ pad 71, the $\overline{RAS}$ pad 75 and the common pad 74 of the replacement device 70 are connected to the same terminals of the replacement site 60 as discussed above with respect to FIG. 2A.

In one embodiment, the pads 72 on the replacement device 70 are coupled to the appropriate pads 62 of the replacement site 60 with wire bonds formed by a conventional programmable wire-bonding machine (not shown). Typical wire-bonding machines may be programmed to automatically couple the pads 72 of the replacement device 70 to the appropriate terminals of the replacement site 60 that correspond to the defective component. For example, the wire-bonding machine may be programmed to couple the replacement dedicated pad 73 on the replacement device 70 to either the first or second dedicated replacement terminals 66 or 68 at the replacement site 60 depending on whether the first or the second component 40 or 50 is to be replaced.

An advantage of the PCB 30 illustrated in FIGS. 1–2B is that the replacement site 60 has common terminals and dedicated terminals coupled to corresponding terminals at the primary sites so that a single replacement site can be used to selectively couple a replacement device to one of a plurality of primary sites. The PCB 30 shown in FIGS. 1–2B accordingly provides the capacity to substitute a replacement device for any one of the components without unduly increasing the size of the PCB 30. It will be appreciated that reducing the size of the PCB 30 is often important to reduce material costs and to reduce the space that the PCA 20 occupies in the finished product. Therefore, the PCB 30 is very useful for SIMMs and DIMMs in computers.

A further advantage of the PCB 30 illustrated in FIGS. 1–2B is that the replacement terminals 62 of the replacement site 60 are pre-wired to corresponding terminals of the primary sites. Therefore, separate wires from the replacement site 60 to terminals on the PCB 30 do not need to be connected when the replacement device 70 is installed. Such separate wiring is not only costly and time-consuming to install, but is also cumbersome and may interfere with other IC devices on a PCB 30. Instead, the PCB 30 shown in FIGS. 1–2B is pre-wired to support a replacement device 70 in an efficient, production-line operation at the point of manufacture.

Figure 3A:
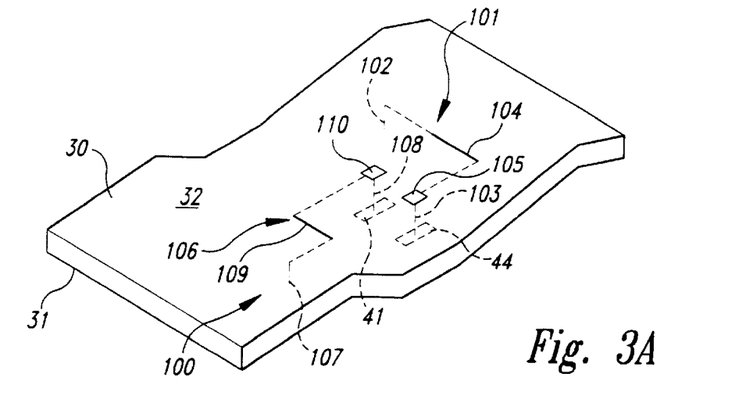
FIG. 3A is a partial isometric view of an embodiment of a disabling site on a printed circuit board in accordance with the invention.

In addition to coupling the replacement device 70 to the PCB 30 so that it can operate in place of a defective component, the defective component is disabled without physically removing it from the PCB 30. FIG. 3A is an isometric view of a backside 32 of the PCB 30 showing a disabling site 100 to disable a component on a front side 31 of the PCB 30 (shown in FIG. 1). Each disabling site 100 is generally positioned on the backside 32 opposite from the component that it can disable. Alternatively, the disabling sites may be positioned on the front side 31 adjacent to the primary sites (not shown). Each disabling site may be separately manipulated for substantially preventing a corresponding component from interfering with the operation of the replacement device 70 and the other devices in the circuit.

The disabling site 100 shown in FIG. 3A is configured to disable a defective component (e.g. a memory device) by placing $\overline{RAS}$ high or disconnecting $V_{cc}$ to the defective component. For example, when the disabling site 100 is coupled to the first primary site 40 (FIG. 1) to disable the first component 80 (FIG. 1), the disabling site 100 may include a $\overline{RAS}$ trace 101 with a first end 102 coupled to $\overline{RAS}$ (not shown) and a second end 103 coupled to the first $\overline{RAS}$ terminal 44 of the primary site 40 on the front side 31 of the PCB 30. The $\overline{RAS}$ trace 101 may have a surface portion 104 positioned at or just below the backside 32 of the PCB 30 and a disable pad 105 on the backside 32. The disabling site 100 may also include a $V_{cc}$ trace 106 with a first end 107 coupled to $V_{cc}$ (not shown) and a second end 108 coupled to the first $V_{cc}$ terminal 41 of the primary site 40 on the front side 31. The $V_{cc}$ trace 106 generally has a surface portion 109 on the backside 32 and a connection pad 110 positioned proximate to the disable pad 105.

Figure 3B:
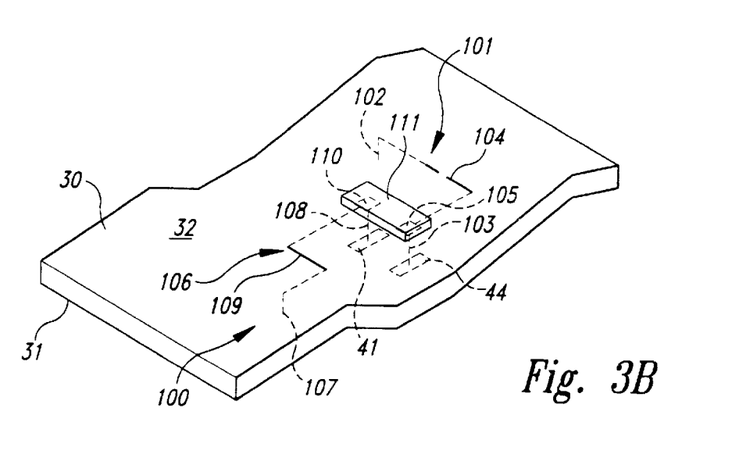
FIG. 3B is a partial isometric view of the embodiment of the disabling site of FIG. 3A coupled to the first component in which the first component is disabled by coupling a selected terminal to a supply voltage.

FIG. 3B is a partial isometric view of the backside 32 of the PCB 30 that, together with FIG. 1, illustrates the operation of the disabling site 100. To disable the first component 80, a conductor 111 (e.g., a jumper or mass of solder) is placed across the disable pad 105 and the connection pad 110 to apply the supply voltage $V_{cc}$ to the $\overline{RAS}$ terminal 44 of the primary site 40. The $\overline{RAS}$ trace 101 is then severed at the surface portion 104 to isolate the $\overline{RAS}$ terminal 44 from the $\overline{RAS}$ terminals of other components.

When $V_{cc}$ is applied to the first $\overline{RAS}$ pad 85 of the first component 80 via the $\overline{RAS}$ terminal 44, the first component 80 is disabled because operation of the first component 80 is triggered only when a low voltage is applied to the first $\overline{\text{RAS}}$ pad 85. When the first $\overline{\text{RAS}}$ pad 85 is connected to $V_{cc}$, the terminals of the first component 80 are placed in a high impedance state so that the first component 80 is effectively disabled without physically detaching the first component 80 from the PCB 30. Thus, rather than heating or cutting each of the connections to the first component 80 and then physically removing the first component 80 from the PCB 30 (as performed by conventional replacement methods), disabling sites are provided that permit the first component 80 (when defective) to be quickly disabled by manipulating the voltage at a single terminal of the defective component. The PCB 30, therefore, generally reduces the labor and expense required to replace defective devices on PCAs.

Still another advantage of the PCAs shown in the figures is that they reduce the likelihood that replacing defective devices will damage or disable other operable devices on the PCB 30. Unlike conventional devices and methods, the PCB 30 is not heated to physically remove the defective component from the PCB 30. Thus, the likelihood that disabling the defective component will have any deleterious effect on the surrounding operable devices may be reduced.

Figure 3C:
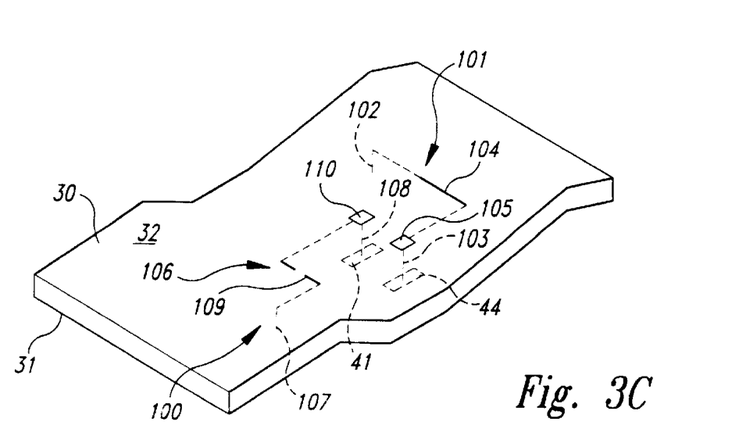
FIG. 3C is a partial isometric view of the embodiment of the disabling site of FIGS. 3A and 3B in which the first component is disabled by interrupting power supplied to the first component.

A defective component may also be disabled by disconnecting $V_{cc}$ from the defective component. FIG. 3C is a partial isometric view of the disabling site 100 in which the first component 80 (FIG. 1) is disabled by disconnecting $V_{cc}$ from the $V_{cc}$ terminal 41 of the primary site 40. To disconnect $V_{cc}$ from the $V_{cc}$ terminal 41, the surface portion 109 of the $V_{cc}$ trace 106 is severed to cut the supply voltage to the first component 80. When the first component 80 is a memory device, cutting $V_{cc}$ will place the device in a state in which its terminals are not at a high impedance state. Although cutting $V_{cc}$ effectively disables a defective memory device, it places the defective memory device in a state in which signals from other devices may be applied to its terminals without affecting the other memory devices.

In another embodiment of the invention (not shown), the defective component may be disabled by applying a voltage to other terminals of the defective component. For example, a column address strobe ($\overline{\text{CAS}}$) terminal (not shown) may be coupled to $V_{cc}$ to raise the impedance of the terminals of the defective component and disable it from operating.

In another embodiment (not shown), the defective component is disabled by coupling $V_{cc}$ to an output enable ($\overline{\text{OE}}$) terminal (not shown).

In still another embodiment, a voltage less than $V_{cc}$, yet sufficient to disable the first component 80, is applied to the $\overline{\text{CAS}}$, $\overline{\text{RAS}}$ or $\overline{\text{OE}}$ terminal of the defective component. In each of these alternate embodiments, the defective component is effectively disabled without physically detaching it from the PCB 30.

Figure 4A:
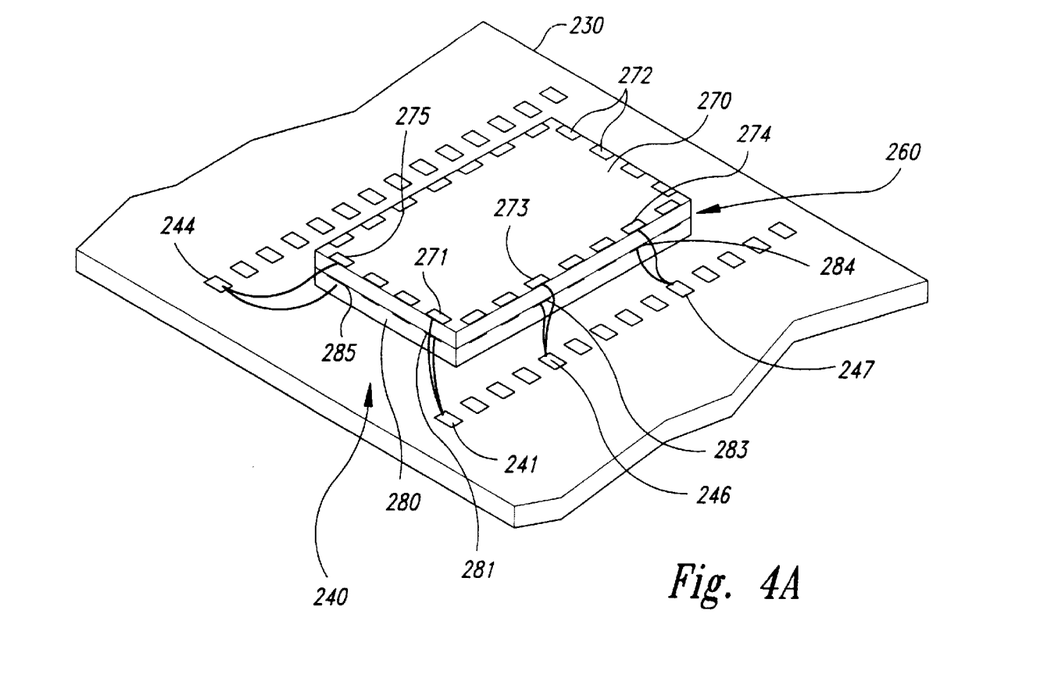
FIG. 4A is a partial isometric view of another embodiment of a method and apparatus in accordance with the invention in which a replacement site and replacement device are positioned on a surface of a defective component.

FIG. 4A is a partial isometric view of another embodiment of the invention in which a replacement device 270 is mounted directly to a defective component 280. The defective component 280 shown in FIG. 4A is a semiconductor die coupled to a site 240 on a PCB 230 with wire-bonds in substantially the same manner as described above with reference to FIGS. 1–2B. The defective component 280 may accordingly be coupled to the PCB 230 as follows: a $V_{cc}$ pad 281 on the component 280 is coupled to a $V_{cc}$ terminal 241 on the PCB 230; a dedicated pad 283 on the component 280 is coupled to a dedicated terminal 246 on the PCB 230 to couple the component 280 to signals unique to the component 280; a common pad 284 on the component 280 is coupled to a common terminal 247 on the PCB 230 to couple the component 280 to signals common to all of the components; and in the case of memory devices, a $\overline{\text{RAS}}$ pad 285 on the component 280 is coupled to a $\overline{\text{RAS}}$ terminal 244 on the PCB 230.

When the defective component 280 is to be replaced, the replacement device 270 may be bonded with an adhesive to a replacement site 260 on the top surface of the defective component 280. The replacement device 270 is coupled to the circuit by connecting pads 272 of the replacement device 270 to corresponding terminals of the site 240 on the PCB 230. Accordingly, a common pad 274 of the replacement device 270 is connected to the common terminal 247 on the PCB 230, a dedicated pad 273 of the replacement device 270 is connected to the dedicated terminal 246 on the PCB 230, a $\overline{\text{RAS}}$ pad 275 on the replacement device 270 is connected to the $\overline{\text{RAS}}$ terminal 244 on the PCB 230 and a $V_{cc}$ pad 271 of the replacement device 270 is connected to the $V_{cc}$ terminal on the PCB 230.

Figure 4B:
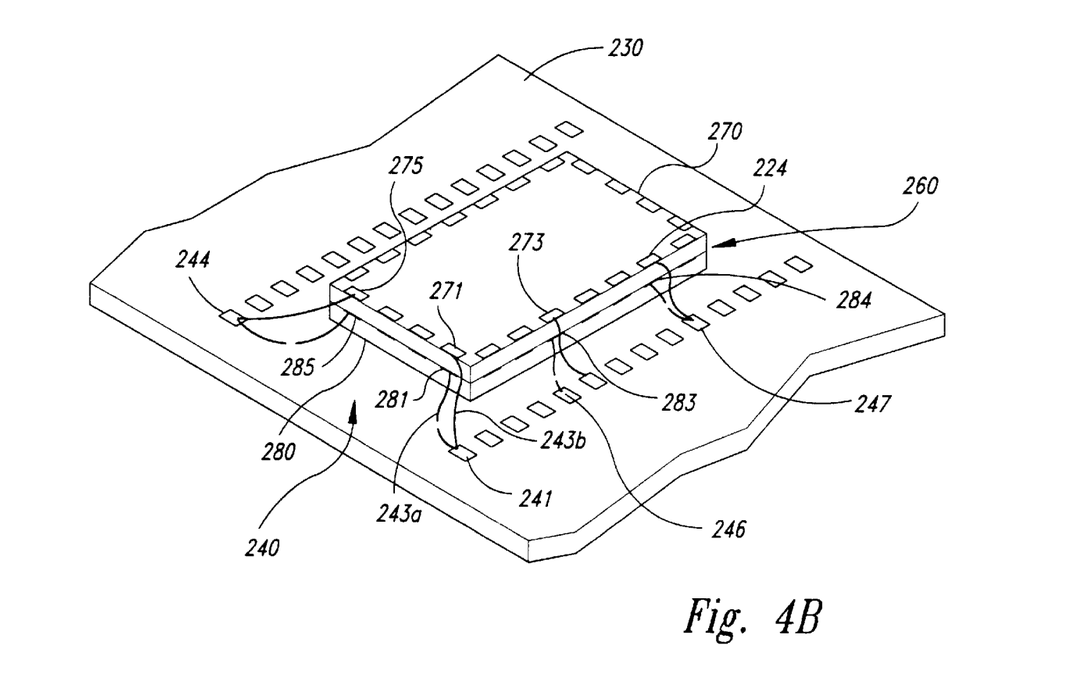
FIG. 4B is a partial isometric view of the apparatus of FIG. 4A with a component disabled by interrupting a supply voltage to the component.

FIG. 4B is an isometric view of an embodiment of the method shown in FIG. 4A in which the replacement device 270 is connected to the replacement site 260 to permit the defective component 280 to be disabled by disconnecting $V_{cc}$. A line 243a may be cut to disconnect the $V_{cc}$ pad 281 on the component 280 from $V_{cc}$. The line 243b remains connected between the $V_{cc}$ terminal 241 and the $V_{cc}$ pad 271 on the replacement device 270 to supply power to the replacement device. In the embodiment shown in FIG. 4B, all lines between the disabled device 280 and the terminals on the PCB 230 are disconnected to eliminate any electrical connections between the disabled device and other devices in the circuit. In another embodiment, all the lines connecting the disabled device 280 to the terminals of the PCB 230 are physically removed so that the lines do not contact and potentially short-circuit lines between the replacement device 270 and the terminals of the PCB.

Figure 5:
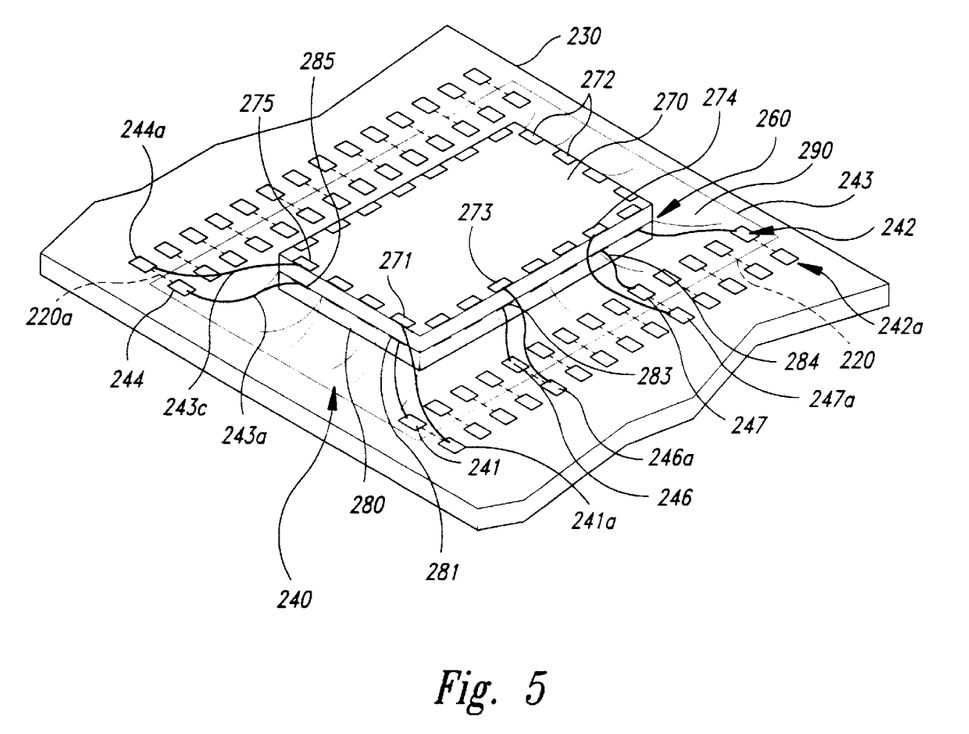
FIG. 5 is a partial isometric view of another embodiment of a method and apparatus in accordance with the invention in which a replacement site and a replacement device are positioned on a surface of a defective component.

The defective component may also be disabled by applying $V_{cc}$ to the $\overline{\text{RAS}}$ pad of the defective component. FIG. 5 is an isometric view of an alternate embodiment of the invention in which the replacement device 270 is mounted directly to the defective component 280. The defective device 280 is encapsulated in a hard, protective coating 290 which may be transparent, as shown in FIG. 5. The protective coating 290 covers the defective device, the terminals 242 and the gold wire bonds extending therebetween. The protective coating 290 accordingly protects electrical connections to the defective device 280, but also makes severing the connections impractical. Therefore, replacement terminals 242a are provided adjacent the terminals 242, external to the protective coating 290. Each replacement terminal 242a is electrically connected with a trace 220 to a corresponding terminal 242.

When the defective component 280 is to be replaced, the replacement device 270 may be bonded with an adhesive to the replacement site 260 on the top surface of the defective component 280, as discussed previously with reference to FIG. 4A. The replacement device 270 is coupled to the circuit by connecting pads 272 of the replacement device 270 to corresponding replacement terminals 242a. Accordingly, the common pad 274 of the replacement device 270 is connected to common terminal 247a on the PCB 230, the dedicated pad 273 of the replacement device 270 is connected to dedicated terminal 246a on the PCB 230, the $V_{cc}$ pad 271 of the replacement device 270 is connected to $V_{cc}$ terminal 241a on the PCB 230, and the $\overline{\text{RAS}}$ pad 275 of the replacement device 270 is connected to replacement $\overline{\text{RAS}}$ terminal 244a.

The defective device 280 may then be disabled by applying $V_{cc}$ to the $\overline{\text{RAS}}$ terminal 244, using a replacement site which may be positioned on the back side of the PCB 230 in a manner substantially similar to the operation of the disabling site 100, discussed previously with reference to FIG. 3B. Additionally, the replacement $\overline{\text{RAS}}$ terminal 244*a* may be isolated from the $\overline{\text{RAS}}$ terminal 244 by severing a trace 220*a* connecting the replacement $\overline{\text{RAS}}$ terminal to the RAS terminal.

An advantage of the methods shown in FIGS. 4A–5 is that a PCB with a separate replacement site is not required. Since the replacement site 260 is a surface of the defective component, the replacement site does not require any additional surface area on the printed circuit board 230. It will be appreciated that in some applications, it is desirable to conserve printed circuit board surface area, for example, where the printed circuit board 230 is to be installed in a compact product. Thus the replacement site 260 improves the versatility of the printed circuit board 230 by reducing its size.

Figure 6:
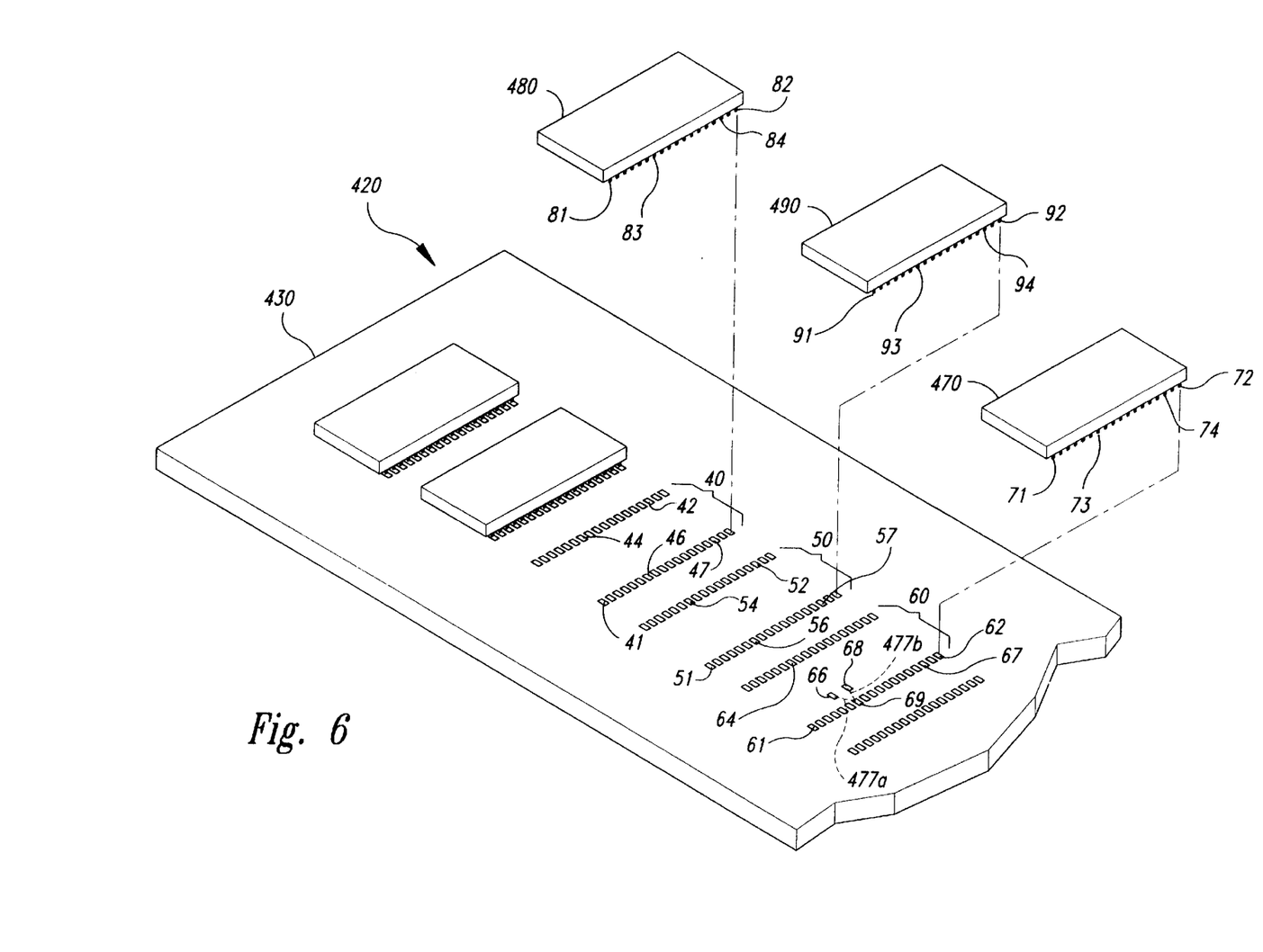
FIG. 6 is a partial exploded isometric view of still another embodiment of an apparatus in accordance with the invention for substituting a replacement device for a defective component.

FIG. 6 is a partially exploded isometric view of an alternate embodiment of an electrical assembly 420 in accordance with the invention in which a plurality of flip chip integrated circuit devices are mounted to a plurality of primary sites on a PCB 430. The PCB 430 is substantially the same as the PCB 30 in FIG. 1, but the flip chip integrated circuit devices, which may include ball grid arrays, or chip scale packages, generally have contacts, such as solder balls, bonded directly to terminals 42 on the surface of the PCB 430. The solder balls may form two rows, as shown in FIG. 6, or may have other arrangements in other embodiments. Additional bonding is provided by an underfill layer (not shown) positioned between the flip chip component and the PCB 430. The PCB 430 may accordingly have a plurality of primary sites, including the first primary site 40 to which a first flip chip component 480 is attached, the second primary site 50 to which a second flip chip component 490 is attached, and the replacement site 60 to which a replacement flip chip component 470 may be attached. The contacts of the flip chip components 480 and 490 are identified by the same reference numbers as the pads of the die components 80 and 90 in FIG. 1, and the terminals in the PCB 430 are identified by the same reference numbers as the terminals on the PCB 30. Accordingly, the first and second flip chip components 480 and 490 are coupled to the primary sites 40 and 50 on the PCB 430 substantially as described above in FIG. 1 with respect to the die components 80 and 90 on the PCB 30, the primary difference being that the contacts of the flip chip components are bonded directly to the corresponding terminals on the PCB, eliminating the need for gold wire bond.

The PCB 430, however, may differ slightly from the PCB 30 in FIG. 1 at the replacement site 60. The dedicated contact 73 of the replacement flip chip device 470 is connected directly to a single dedicated terminal 69 at the replacement site 60, and the first and second dedicated terminals 66 and 68 of the replacement site 60 are positioned proximate to the single dedicated terminal 69. In the embodiment shown in FIG. 6, the dedicated terminals 66, 68 and 69 are positioned on the front side of the PCB 430. In alternate embodiments, the dedicated terminals 66, 68 and 69 may be positioned on the backside of the PCB 430. In operation, the replacement device 470 is connected to the replacement site 60 to substitute for one of the first or second components 480 or 490. If the replacement device 470 is to substitute for the first component 480, the single dedicated terminal 69 is coupled to the first dedicated replacement terminal 66 with a line 477*a*. The dedicated pin 73 on the replacement device 470 would accordingly be coupled to the dedicated contact 46 of the first primary site 40 because the dedicated contact 46 and the first dedicated replacement terminal 66 are interconnected within the PCB 430 (not shown), as described above with respect to the PCB 30. Similarly, if the replacement device 470 is to substitute for the second component 490, the single dedicated terminal 69 is coupled to the second dedicated replacement terminal 68 with a line 477*b*. The dedicated contact 73 of the replacement device 470 would then be coupled to the dedicated terminal 56 of the second primary site 50 because the dedicated terminal 56 and the second dedicated replacement terminal 68 are interconnected within the PCB 430 (also described with respect to the PCB 30). Thus, the packaged replacement device 470 may be coupled to the PCB 430 to operate in place of a selected defective component.

In addition to coupling the replacement device 470 to operate in place of a defective component, the defective component is preferably disabled on the PCB 430 without removing it from the assembly 420. Accordingly, the PCB 430 may also have a disabling site substantially similar to the disabling sites 100 discussed previously with reference to FIGS. 3A–3C. In one embodiment, the disabling site may be used to disable the defective device by placing $\overline{\text{RAS}}$ high, in a manner substantially similar to that discussed with reference to FIG. 3B. In another embodiment, the disabling site may be used to disable the defective component by disconnecting $V_{cc}$ to the defective component, in a manner substantially similar to that discussed with reference to FIG. 3C. Thus, the advantages of an embodiment of the PCB 430 are substantially the same as those described above with respect to an embodiment of the PCB 30.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of repairing an electrical assembly having a defective component, comprising:

maintaining the defective component physically attached to the electrical assembly; and substituting a replacement device on the electrical assembly to operate in place of the defective component by attaching the replacement device to a pre-wired replacement site on the electrical assembly, the replacement site being spaced apart from the defective component.

2. The method of claim 1 wherein the act of substituting the replacement device for the component comprises:

operatively disabling the component; and coupling the replacement device to the electrical assembly so that a plurality of connectors of the replacement device are coupled to a corresponding plurality of input and output lines of the component.

3. The method of claim 2 wherein the act of disabling the component comprises manipulating a voltage applied to a connector of the component to place the component in a high impedance state.

4. The method of claim 3 wherein the act of manipulating a voltage comprises applying a voltage to a $\overline{\text{RAS}}$ terminal of the component to place the $\overline{\text{RAS}}$ terminal in high state.

5. The method of claim 3 wherein the act of manipulating a voltage comprises disconnecting a supply voltage from a $V_{cc}$ terminal of the component.

6. The method of claim 3 wherein the act of manipulating a voltage comprises applying a voltage to an $\overline{\text{OE}}$ terminal of the component.

7. The method of claim 2 wherein the act of coupling the replacement device to the electrical assembly comprises attaching the replacement device to the component and connecting the plurality of connectors of the replacement device to corresponding connectors on the component except for a selected connector on the replacement device corresponding to a manipulated connector on the component that is manipulated to electrically disable the component, the selected connector being coupled directly to an electrical connection to which the manipulated connector is coupled.

8. The method of claim 7 wherein the manipulated connector is a $\overline{RAS}$ terminal on the component and the electrical connection is a $\overline{RAS}$ line, and wherein the act of coupling the replacement device to the electrical assembly comprises coupling a $\overline{RAS}$ connector on the replacement device to the $\overline{RAS}$ line when the $\overline{RAS}$ terminal on the component is disconnected from the $\overline{RAS}$ line and connected to a supply voltage.

9. The method of claim 7 wherein the manipulated connector is an $\overline{OE}$ terminal on the component and the electrical connection is an $\overline{OE}$ line, and wherein the act of coupling the replacement device to the electrical assembly comprises coupling an $\overline{OE}$ connector on the replacement device to the $\overline{OE}$ line when the $\overline{OE}$ connector on the component is disconnected from the $\overline{OE}$ line and connected to a supply voltage.

10. The method of claim 7 wherein the manipulated connector is a $V_{cc}$ terminal on the component and the electrical connection is a supply voltage line, and wherein the act of coupling the replacement device to the electrical assembly comprises coupling a $V_{cc}$ connector on the replacement device to the supply voltage line when the $V_{cc}$ terminal on the component is disconnected from the supply voltage line.

11. The method of claim 2, further comprising connecting a plurality of connectors of the replacement device to a plurality of corresponding terminals of the replacement site such that a connector on the replacement device is coupled to a dedicated terminal at the replacement site that is coupled to signals unique to the component.

12. The method of claim 11 wherein the act of disabling the component comprises manipulating a voltage applied to a connector of the component to place the component in a high impedance state.

13. The method of claim 12 wherein the act of manipulating a voltage comprises disconnecting a $\overline{RAS}$ connector on the component from a $\overline{RAS}$ terminal on the electrical assembly and applying a voltage to the $\overline{RAS}$ connector of the component to place the $\overline{RAS}$ connector in a high state.

14. The method of claim 12 wherein the act of manipulating a voltage comprises disconnecting an $\overline{OE}$ connector on the component from an $\overline{OE}$ terminal on the electrical assembly and applying a voltage to the $\overline{OE}$ connector of the component to place the $\overline{OE}$ connector in a high state.

15. The method of claim 12 wherein the act of manipulating a voltage comprises disconnecting a supply voltage from a $V_{cc}$ connector of the component.

16. A method of repairing an electrical module having a defective primary integrated circuit component, comprising:
disabling the primary integrated circuit component by interrupting a conductive path of a conductive connector attached directly to the primary integrated circuit component;
maintaining the primary integrated circuit component physically attached to the module; and
coupling a replacement integrated circuit device directly to the primary integrated circuit component to enable the replacement integrated circuit device to operate in place of the primary integrated circuit component.

17. The method of claim 16 wherein the conductive connector includes a wire and the act of disabling the component comprises severing the wire.

18. The method of claim 16 wherein the act of coupling the replacement device to the electrical assembly comprises attaching the replacement device to the component and connecting the plurality of connectors of the replacement device to corresponding connectors on the component except for a selected connector on the replacement device corresponding to a manipulated connector on the component that is manipulated to electrically disable the component, the selected connector being coupled directly to an electrical connection to which the manipulated connector is coupled.

19. The method of claim 18 wherein the manipulated connector is a $\overline{RAS}$ terminal on the component and the electrical connection is a $\overline{RAS}$ line, and wherein the act of coupling the replacement device to the electrical assembly comprises coupling a $\overline{RAS}$ connector on the replacement device to the $\overline{RAS}$ line when the $\overline{RAS}$ terminal on the component is disconnected from the $\overline{RAS}$ line and connected to a supply voltage.

20. The method of claim 18 wherein the manipulated connector is an $\overline{OE}$ terminal on the component and the electrical connection is an $\overline{OE}$ line, and wherein the act of coupling the replacement device to the electrical assembly comprises coupling an $\overline{OE}$ connector on the replacement device to the $\overline{OE}$ line when the $\overline{OE}$ connector on the component is disconnected from the $\overline{OE}$ line and connected to a supply voltage.

21. The method of claim 18 wherein the manipulated connector is a $V_{cc}$ terminal on the component and the electrical connection is a supply voltage line, and wherein the act of coupling the replacement device to the electrical assembly comprises coupling a $V_{cc}$ connector on the replacement device to the supply voltage line when the $V_{cc}$ terminal on the component is disconnected from the supply power line.

22. The method of claim 16 wherein the act of coupling the replacement device to the electrical assembly comprises attaching the replacement device to a pre-wired replacement site on the electrical assembly and connecting the plurality of connectors of the replacement device to a plurality of corresponding terminals of the replacement site such that a connector on the replacement device is coupled to a dedicated terminal at the replacement site that is coupled to signals unique to the component.

23. The method of claim 22 wherein the act of disabling the component comprises manipulating a voltage applied to a connector of the component to place the component in a high impedance state.

24. The method of claim 22 wherein the act of manipulating a voltage comprises disconnecting a $\overline{RAS}$ connector on the component from a $\overline{RAS}$ terminal on the electrical assembly and applying a voltage to the $\overline{RAS}$ connector of the component to place the $\overline{RAS}$ connector in a high state.

25. The method of claim 22 wherein the act of manipulating a voltage comprises disconnecting an $\overline{OE}$ connector on the component from an $\overline{OE}$ terminal on the electrical assembly and applying a voltage to the $\overline{OE}$ connector of the component to place the $\overline{OE}$ connector in a high state.

26. The method of claim 22 wherein the act of manipulating a voltage comprises disconnecting a supply voltage from a $V_{cc}$ connector of the component.

27. A method for repairing an electrical assembly having a defective primary integrated circuit component mounted to a printed circuit board, comprising:

disabling the component without physically removing it from the printed circuit board;

coupling a replacement integrated circuit device to a pre-wired replacement site of the electrical assembly spaced apart from the defective component so that a plurality of terminals of the replacement device are coupled to appropriate input and output lines corresponding to like terminals on the component; and enabling the replacement device to operate in place of the component.

28. The method of claim 27 wherein the disabling step comprises applying a voltage to a $\overline{RAS}$ terminal of the component to place the $\overline{RAS}$ terminal in a high state.

29. The method of claim 27 wherein the disabling step comprises disconnecting a supply voltage from the component.

30. The method of claim 27 wherein the coupling step comprises electrically coupling terminals of the component directly to corresponding terminals of the replacement device except for a manipulated terminal on the component at which a voltage is manipulated to place the component in a high impedance state.

31. The method of claim 30 wherein the coupling step comprises attaching the replacement device to the component.

32. A method for repairing a circuit having a primary integrated circuit component mounted to a mounting surface, comprising:

operatively impairing the primary integrated circuit component from operating in the circuit by applying a non-zero voltage to a conductive connector attached to a selected terminal of the primary integrated circuit component without physically removing the component from the mounting surface; and coupling a replacement device directly to the primary integrated circuit component to operate in place of the component.

33. The method of claim 32 wherein the selected terminal is a $\overline{RAS}$ terminal and the impairing step comprises applying the non-zero voltage to the [a] $\overline{RAS}$ terminal of the component to place the $\overline{RAS}$ terminal in a high state.

34. The method of claim 32 wherein the selected terminal includes an $\overline{OE}$ terminal and the impairing step comprises applying the non-zero voltage to the $\overline{OE}$ terminal of the component.

35. A method for repairing a memory module having a plurality of memory devices mounted to a printed circuit board, wherein at least one memory device is defective, the method comprising:

placing the defective memory device in a high impedance state sufficient to operatively disable the defective memory device without removing the defective memory device from the printed circuit board; and coupling a replacement memory device to a pre-wired replacement site on the printed circuit board to operate in place of the defective memory device.

36. The method of claim 35 wherein the act of placing the defective memory device in a high impedance state comprises applying a voltage to a $\overline{RAS}$ terminal of the defective memory device to place the $\overline{RAS}$ terminal in a high state.

37. The method of claim 35 wherein the act of placing the defective memory device in a high impedance state comprises disconnecting a supply voltage from a $V_{cc}$ terminal of the defective memory device.

38. The method of claim 35 wherein the act of coupling comprises electrically coupling input and output lines of the defective memory device to corresponding terminals of the replacement memory device.

39. The method of claim 35, further comprising attaching the replacement memory device directly to the defective memory device.

40. The method of claim 35, further comprising attaching the replacement memory device to a replacement site on the printed circuit board that is pre-wired to corresponding input and output lines of the defective memory device.

41. The method of claim 40 wherein an act of placing the defective memory device in a high impedance state comprises applying a voltage to a $\overline{RAS}$ terminal of the defective memory device to place the $\overline{RAS}$ terminal in a high impedance state.

42. A method for manufacturing a memory module, comprising:

attaching a plurality of memory devices to a module;

coupling the plurality of memory devices to a circuit in which the memory devices receive and write data;

operatively disabling a defective memory device without physically removing the defective memory device from the module; and enabling a replacement memory device to operate on the module in place of the defective memory device by attaching the replacement memory device to a replacement site on the module that is pre-wired to corresponding input and output lines of the defective memory device the replacement site being spaced apart from the defective memory device.

43. The method of claim 42 wherein the disabling step comprises applying a voltage to a $\overline{RAS}$ terminal of the defective memory device to place the $\overline{RAS}$ terminal in a high state.

44. The method of claim 42 wherein the disabling step comprises disconnecting a supply voltage from a $V_{cc}$ terminal of the defective memory device.

45. The method of claim 42 wherein the enabling step comprises electrically connecting input and output lines corresponding to the defective memory device to corresponding terminals of the replacement memory device.

46. A printed circuit board comprising:

a first primary site configured to receive a first component, the first primary site having a plurality of terminals including a first common terminal and a first dedicated terminal adapted to be coupled to a corresponding common pad and a corresponding dedicated pad on the first component;

a second primary site configured to receive a second component, the second primary site having a plurality of terminals including a second common terminal and a second dedicated terminal adapted to be coupled to a corresponding common pad and a corresponding dedicated pad on the second component; and a pre-wired replacement site spaced apart from the first and second primary sites, the replacement site having a plurality of terminals including a first dedicated replacement terminal coupled to the first dedicated terminal of the first primary site, a second dedicated replacement terminal coupled to the second dedicated terminal of the second primary site, and a common replacement terminal coupled to the first and second common terminals of the first and second primary sites, the replacement site being configured to receive a replacement device to operate in place of the first and second components, at least one of the primary sites being configured to disable one of the first and second components without removing either of the first and second integrated circuit devices from the printed circuit board.

47. The printed circuit board of claim 46 wherein:

the first primary site is configured to receive a memory device such that the plurality of terminals of the first primary site includes a first $V_{cc}$ terminal, a first $\overline{RAS}$ terminal and a dedicated first $\overline{CAS}$ terminal;

the second primary site is configured to receive a memory device such that the plurality of terminals of the second primary site includes a second $V_{cc}$ terminal, a second $\overline{RAS}$ terminal and a dedicated second $\overline{CAS}$ terminal; and the replacement site has a $V_{cc}$ terminal, a $\overline{RAS}$ terminal coupled to the first $\overline{RAS}$ terminal of the first primary site and the second $\overline{RAS}$ terminal of the second primary site, a first replacement $\overline{CAS}$ terminal coupled to the first CAS terminal of the first primary site, and a second replacement $\overline{CAS}$ terminal coupled to the second $\overline{CAS}$ terminal of the second primary site, the first replacement CAS terminal of the replacement site being adapted to be coupled to a replacement device when the replacement device is to operate in place of a component coupled to the first primary site, and the second replacement $\overline{CAS}$ terminal of the replacement site being adapted to be coupled to the replacement device when the replacement device is to operate in place of a component coupled to the second primary site.

48. The printed circuit board of claim 47, further comprising a disabling site coupled to a primary site to manipulate a voltage applied to a terminal of the primary site and place a component coupled to the primary site in a high impedance state.

49. The printed circuit board of claim 48, wherein each disabling site comprises:

a $V_{cc}$ line coupled to a disabling $V_{cc}$ pad, the disabling $V_{cc}$ pad being separate from a terminal of a primary site;

an input/output line coupled to a signal pad, the signal pad being separate from the disabling $V_{cc}$ pad and coupled to a corresponding terminal of a primary site to communicate signals to a component in normal operations, and the signal pad being coupled to the disabling $V_{cc}$ pad and the input/output line being disconnected from the signal pad to bring the corresponding terminal of the primary site to a high state and operatively disable the corresponding component when the corresponding component is defective.

50. A method of repairing an electrical assembly having a defective component, comprising:

maintaining the defective component physically attached to the electrical assembly; and substituting a replacement device on the electrical assembly to operate in place of the defective component by operatively disabling the component and coupling the replacement device to the electrical assembly by attaching the replacement device to the component and connecting a plurality of connectors of the replacement device to corresponding connectors on the component except for a selected connector on the replacement device corresponding to a manipulated connector on the component that is manipulated to electrically disable the component, the selected connector being coupled directly to an electrical connection to which the manipulated connector is coupled.

51. The method of claim 50 wherein the manipulated connector is a $\overline{RAS}$ terminal on the component and the electrical connection is a $\overline{RAS}$ line, and wherein the act of coupling the replacement device to the electrical assembly comprises coupling a $\overline{RAS}$ connector on the replacement device to the $\overline{RAS}$ line when the $\overline{RAS}$ terminal on the component is disconnected from the $\overline{RAS}$ line and connected to a supply voltage.

52. The method of claim 50 wherein the manipulated connector is an $\overline{OE}$ terminal on the component and the electrical connection is an $\overline{OE}$ line, and wherein the act of coupling the replacement device to the electrical assembly comprises coupling an $\overline{OE}$ connector on the replacement device to the $\overline{OE}$ line when the $\overline{OE}$ connector on the component is disconnected from the $\overline{OE}$ line and connected to a supply voltage.

53. The method of claim 50 wherein the manipulated connector is a $V_{cc}$ terminal on the component and the electrical connection is a supply voltage line, and wherein the act of coupling the replacement device to the electrical assembly comprises coupling a $V_{cc}$ connector on the replacement device to the supply voltage line when the $V_{cc}$ terminal on the component is disconnected from the supply voltage line.

54. A method of repairing an electrical assembly having a defective component, comprising:

maintaining the defective component physically attached to the electrical assembly; and substituting a replacement device on the electrical assembly to operate in place of the defective component by operatively disabling the component and coupling the replacement device to the electrical assembly by attaching the replacement device to a pre-wired replacement site on the electrical assembly and connecting a plurality of connectors of the replacement device to a plurality of corresponding terminals of the replacement site such that a connector on the replacement device is coupled to a dedicated terminal at the replacement site that is coupled to signals unique to the component.

55. A method of repairing an electrical module having a defective primary integrated circuit component, comprising:

disabling the primary integrated circuit component;

maintaining the primary integrated circuit component physically attached to the module; and coupling a replacement integrated circuit device to the module by attaching the replacement device to the component and connecting the plurality of connectors of the replacement device to corresponding connectors on the component except for a selected connector on the replacement device corresponding to a manipulated connector on the component that is manipulated to electrically disable the component, the selected connector being coupled directly to an electrical connection to which the manipulated connector is coupled to enable the replacement integrated circuit device to operate in place of the primary integrated circuit component.

56. The method of claim 55 wherein the manipulated connector is a $\overline{RAS}$ terminal on the component and the electrical connection is a $\overline{RAS}$ line, and wherein the act of coupling the replacement device to the electrical assembly comprises coupling a $\overline{RAS}$ connector on the replacement device to the $\overline{RAS}$ line when the $\overline{RAS}$ terminal on the component is disconnected from the $\overline{RAS}$ line and connected to a supply voltage.

57. The method of claim 55 wherein the manipulated connector is an $\overline{OE}$ terminal on the component and the electrical connection is an $\overline{OE}$ line, and wherein the act of coupling the replacement device to the electrical assembly comprises coupling an $\overline{\text{OE}}$ connector on the replacement device to the $\overline{\text{OE}}$ line when the $\overline{\text{OE}}$ connector on the component is disconnected from the $\overline{\text{OE}}$ line and connected to a supply voltage.

58. The method of claim 55 wherein the manipulated connector is a $V_{cc}$ terminal on the component and the electrical connection is a supply voltage line, and wherein the act of coupling the replacement device to the electrical assembly comprises coupling a $V_{cc}$ connector on the replacement device to the supply voltage line when the $V_{cc}$ terminal on the component is disconnected from the supply power line.

59. A method of repairing an electrical module having a defective primary integrated circuit component, comprising:

disabling the primary integrated circuit component;

maintaining the primary integrated circuit component physically attached to the module; and coupling a replacement integrated circuit device to the module by attaching the replacement device to a pre-wired replacement site on the electrical assembly and connecting the plurality of connectors of the replacement device to a plurality of corresponding terminals of the replacement site such that a connector on the replacement device is coupled to a dedicated terminal at the replacement site that is coupled to signals unique to the component to enable the replacement integrated circuit device to operate in place of the primary integrated circuit component.

60. The method of claim 59 wherein the act of disabling the component comprises manipulating a voltage applied to a connector of the component to place the component in a high impedance state.

61. The method of claim 59 wherein the act of manipulating a voltage comprises disconnecting a $\overline{\text{RAS}}$ connector on the component from a $\overline{\text{RAS}}$ terminal on the electrical assembly and applying a voltage to the $\overline{\text{RAS}}$ connector of the component to place the $\overline{\text{RAS}}$ connector in a high state.

62. The method of claim 59 wherein the act of manipulating a voltage comprises disconnecting an $\overline{\text{OE}}$ connector on the component from an $\overline{\text{OE}}$ terminal on the electrical assembly and applying a voltage to the $\overline{\text{OE}}$ connector of the component to place the $\overline{\text{OE}}$ connector in a high state.

63. The method of claim 59 wherein the act of manipulating a voltage comprises disconnecting a supply voltage from a $V_{cc}$ connector of the component.

64. A method for repairing a memory module having a plurality of memory devices mounted to a printed circuit board, wherein at least one memory device is defective, the method comprising:

placing the defective memory device in a high impedance state sufficient to operatively disable the defective memory device without removing the defective memory device from the printed circuit board by disconnecting a supply voltage from a $V_{cc}$ terminal of the defective memory device; and coupling a replacement memory device to the memory module to operate in place of the defective memory device.

65. A method for repairing a memory module having a plurality of memory devices mounted to a printed circuit board, wherein at least one memory device is defective, the method comprising:

placing the defective memory device in a high impedance state sufficient to operatively disable the defective memory device without removing the defective memory device from the printed circuit board; and coupling a replacement memory device to the memory module by coupling input and output lines of the defective memory device to corresponding terminals of the replacement memory device to operate in place of the defective memory device.

* * * * *